United States Patent
Wang (10) Patent No.: US 12,126,322 B2
(45) Date of Patent: Oct. 22, 2024

(54) CHIP PACKAGING METHOD AND PARTICLE CHIPS

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/315,211

(22) Filed: May 10, 2023

(65) Prior Publication Data

US 2023/0275561 A1  Aug. 31, 2023

Related U.S. Application Data

(62) Division of application No. 17/718,799, filed on Apr. 12, 2022, now Pat. No. 11,683,020.

(30) Foreign Application Priority Data

Oct. 22, 2021 (CN) .......................... 202111235545.7

(51) Int. Cl.
| | |
|---|---|
| *H03H 9/10* | (2006.01) |
| *H03H 3/02* | (2006.01) |
| *H03H 9/05* | (2006.01) |

(52) U.S. Cl.
CPC ............ *H03H 9/1042* (2013.01); *H03H 3/02* (2013.01); *H03H 9/0523* (2013.01)

(58) Field of Classification Search
CPC ...... H03H 9/1042; H03H 3/02; H03H 9/0523; H03H 9/10; H01L 21/50; H01L 21/561; H01L 23/3121; H01L 23/315

USPC .......................................... 333/133, 193–196
See application file for complete search history.

(56) References Cited

U.S. PATENT DOCUMENTS

2022/0399207 A1* 12/2022 Chew .................... H01L 23/295

FOREIGN PATENT DOCUMENTS

| | | |
|---|---|---|
| CN | 112786541 A | 5/2021 |
| TW | 202103271 A | 1/2021 |
| WO | WO 2020/020537 A1 | 1/2020 |

\* cited by examiner

*Primary Examiner* — Rakesh B Patel
*Assistant Examiner* — Jorge L Salazar, Jr.
(74) *Attorney, Agent, or Firm* — Finnegan, Henderson, Farabow, Garrett & Dunner, LLP.

(57) ABSTRACT

A method for packaging chips includes: flip-chip bonding a plurality of filter chips to be packaged on a substrate to be packaged; applying a first mold material layer on the filter chips to be packaged; applying a second mold material layer on a side of the first mold material layer away from the filter chip to be packaged, the first mold material layer and the second mold material layer forming a first mold layer; thinning the first mold material layer and the second mold material layer to expose substrates of the filter chips to be packaged, and thinning the substrates of the filter chips to be packaged to a preset thickness; applying a second mold layer on the exposed substrates of the filter chips to be packaged to obtain a mold structure; and cutting the mold structure into a plurality of particle chips.

9 Claims, 6 Drawing Sheets

CHIP PACKAGING METHOD AND PARTICLE CHIPS

This application is a divisional of application Ser. No. 17/718,799, filed Apr. 12, 2022, which is based upon and claims priority to Chinese Patent Application 202111235545.7, filed on Oct. 22, 2021. The entire contents of the above-referenced applications are incorporated herein by reference.

FIELD OF THE DISCLOSURE

The present application relates to the technical field of chip packaging, in particular, to a chip packaging method and particle chips manufactured using the method.

BACKGROUND

A film bulk acoustic filter wafer consists of a series of film bulk acoustic resonator (FBAR) filter chips formed by connecting a plurality of FBARs in series and/or in parallel. Each resonator has a cavity structure and a piezoelectric and electrode stack film structure suspended on the cavity structure. Since the piezoelectric and electrode stack film structure is very thin and prone to be broken and damaged, the film bulk acoustic filter wafer may not be thinned directly. Usually, the film bulk acoustic filter wafer is packaged at a wafer level, i.e., the piezoelectric and electrode stack film structure is disposed under a cap wafer, whereupon the cap wafer and the substrate of the film bulk acoustic filter wafer are thinned. The film structure is not directly subjected to the pressure and shearing force upon thinning, thereby avoiding the breakage and damage of the film. However, the film bulk acoustic filter wafer being packaged at the wafer level and the cap wafer being added may not facilitate miniaturization of the particle chips even though the thinning is performed subsequently.

SUMMARY

Embodiments of the present disclosure provide a chip packaging method and particle chips manufactured using the same, to facilitate the miniaturization of the sizes of the particle chips.

According to a first aspect of the present disclosure, a method for packaging chips comprises: flip-chip bonding a plurality of filter chips to be packaged on a substrate to be packaged; applying a first mold material layer on the filter chips to be packaged, each filter chip to be packaged, a portion of the first mold material layer corresponding to the filter chip to be packaged, and the substrate to be packaged together enclosing to form a cavity; applying a second mold material layer on a side of the first mold material layer away from the filter chip to be packaged, the first mold material layer and the second mold material layer forming a first mold layer, and the filter chips to be packaged, the first mold layer, and the substrate to be packaged forming a first mold structure; thinning the first mold material layer and the second mold material layer to expose substrates of the filter chips to be packaged, and thinning the substrates of the filter chips to be packaged to a preset thickness; applying a second mold layer on the exposed substrates of the filter chips to be packaged to obtain a second mold structure, a thickness of the second mold structure being smaller than a sum of a thickness of the filter chips to be packaged and a thickness of the substrate to be packaged; and cutting the second mold structure into a plurality of particle chips.

According to a second aspect of the present disclosure, there is provided a particle chip which includes a substrate; a filter chip flip-chip bonded on the substrate; and a first mold layer. The first mold layer includes a first mold material layer enclosing a cavity together with the filter chip and the substrate; and a second mold material layer disposed on a side of the first mold material layer away from the filter chip and the substrate. The particle chip further includes a second mold layer disposed on a side of the filter chip away from the substrate. The particle chip is packaged by forming no cap wafer.

Embodiments of the present disclosure provide the method for packaging chips and the particle chips manufactured using the method. The following technical effects can be achieved: the plurality of filter chips to be packaged are flip-chip bonded on the substrate to be packaged; the filter chips to be packaged are molded to form the first mold layer; each filter chip to be packaged, the portion of the first mold layer corresponding to the filter chip to be packaged, and the substrate to be packaged together enclose to form the cavity; the filter chips to be packaged, the first mold layer, and the substrate to be packaged form the first mold structure; the first mold structure is thinned to obtain a second mold structure whose thickness is smaller than a sum of a thickness of the filter chip to be packaged and a thickness of the substrate to be packaged; and the second mold structure is cut into a plurality of particle chips. As such, since each filter chip to be packaged, the portion of the first mold layer corresponding to the filter chip to be packaged, and the substrate to be packaged together enclose to form the cavity, it is unnecessary to mold the filter chips to be packaged at the wafer level, that is, it is unnecessary to form the cap wafer. Without the cap wafer being formed, the first mold structure is thinned to form the second mold structure so that the particle chips can be miniaturized.

The above summary is only exemplary and illustrative and not intended to limit the present application.

BRIEF DESCRIPTION OF THE DRAWINGS

One or more embodiments will be exemplarily depicted with reference to the accompanying figures. These exemplary depictions and figures do not limit the embodiments. Elements denoted by the same reference numbers in the figures are same or like elements.

REFERENCE NUMERALS

100: filter wafer; 110: filter chip to be packaged; 111: first pad; 112: filter chip substrate; 113: electrode layer; 114: piezoelectric layer; 120 solder bump; 130: substrate to be packaged; 131: substrate base; 132: second pad; 140: first mold material layer; 150: second mold material layer; 160: second mold layer.

DETAILED DESCRIPTION

Implementations of embodiments of the present disclosure will be described in detail below with reference to the accompanying figures. The figures are only for illustration purposes and not intended to limit embodiments of the present disclosure. The implementations set forth in the following description of exemplary embodiments do not represent all implementations consistent with the present disclosure. Instead, they are merely examples of methods and devices consistent with aspects of the disclosure as recited in the appended claims.

Terms such as "first" and "second" in the present disclosure are intended to distinguish similar objects, not necessarily to describe a specific order or sequential order. It should be appreciated that data used in this way may be interchangeable in proper cases to help the embodiments of the present disclosure described herein to be implemented. In addition, terms "include" and "have" and their any variants are intended to cover inclusion without excluding others.

In embodiments of the present disclosure, directional or positional relationship indicated by terms such as "up", "down", "on," "in", "interior", "out", "front" and "rear" is based on the directional or positional relationship shown in the figures. These terms are mainly intended to describe embodiments of the present disclosure, not to limit that the described devices, elements or components must have a specific orientation or must be configured and operated in a specific orientation. Furthermore, in addition to indicating the directional or positional relationship, the above partial terms might also be used to convey other meanings, for example, the term "on" might also be used to indicate a dependency relationship or connectional relationship in some cases. Those having ordinary skill in the art may understand specific meanings of these terms in the embodiments of the present disclosure according to specific situations.

In addition, terms "dispose", "connect" and "fix" should be understood in a broad sense. For example, "connect" may be fixed connection, detachable connection or integral connection, may be mechanical connection or electrical connection, may be direct connection, or indirect connection through an intermediate medium, or may be internal communication between two devices, elements or components. Those having ordinary skill in the art may understand specific meanings of the above terms in the embodiments of the present disclosure according to specific situations.

The term "and/or" is an association relationship describing objects, and indicates there may be three types of relationships. For example, "A and/or B" indicates three types of relationships, namely, "A", "B," or "A and B."

Embodiments of the present disclosure and features in the embodiments may be combined with one another without confliction.

Figure 1:
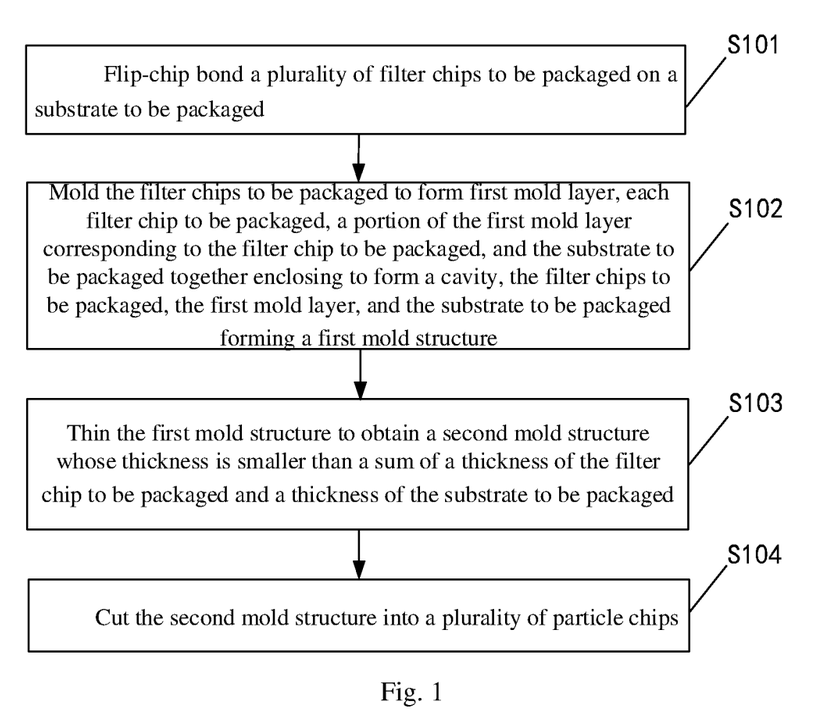
FIG. 1 is a flow chart of a method for packaging chips according to an embodiment.

Referring to FIG. 1, an embodiment of the present disclosure provides a method for packaging chips, comprising:

Step S101: flip-chip bonding a plurality of filter chips to be packaged on a substrate to be packaged;

Step S102: molding the filter chips to be packaged to form a first mold layer, each filter chip to be packaged, a portion of the first mold layer corresponding to the filter chip to be packaged, and the substrate to be packaged together enclosing a cavity, and the filter chips to be packaged, the first mold layer, and the substrate to be packaged forming a first mold structure;

Step S103: thinning the first mold structure to obtain a second mold structure whose thickness is smaller than a sum of a thickness of the filter chip to be packaged and a thickness of the substrate to be packaged before thinning; and Step S104: cutting the second mold structure into a plurality of particle chips.

By the method for packaging chips according to the present embodiment, the plurality of filter chips to be packaged are flip-chip bonded on the substrate to be packaged; the filter chips to be packaged are molded to form the first mold layer; each filter chip to be packaged, the portion of the first mold layer corresponding to the filter chip to be packaged, and the substrate to be packaged together enclose to form the cavity; the filter chips to be packaged, the first mold layer, and the substrate to be packaged form the first mold structure; the first mold structure is thinned to obtain a second mold structure whose thickness is smaller than a sum of a thickness of the filter chip to be packaged and a thickness of the substrate to be packaged; the second mold structure is cut into a plurality of particle chips. As such, since each the filter chip to be packaged, the portion the first mold layer corresponding to the filter chip to be packaged, and the substrate to be packaged together enclose to form the cavity, it is unnecessary to mold the filter chips to be packaged at the wafer level, that is, it is unnecessary to form a cap wafer. Without the cap wafer being formed, the first mold structure is thinned to form the second mold structure so that the particle chips can be miniaturized.

Figure 2:
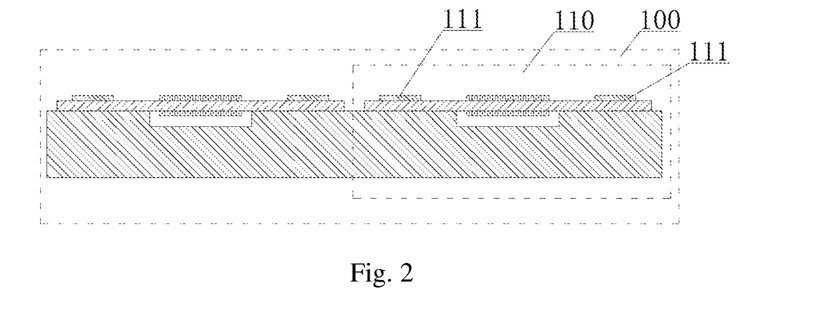
FIG. 2 is a schematic diagram of a filter wafer according to an embodiment.
Figure 3:
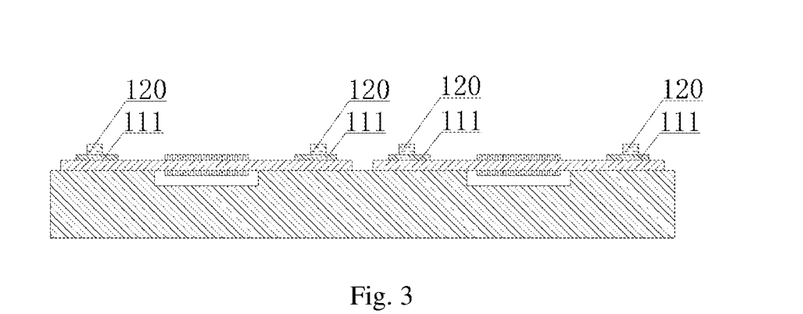
FIG. 3 is a schematic diagram after solder bumps are disposed on the filter wafer according to an embodiment.

In some embodiments, the plurality of filter chips to be packaged are obtained in the following manner. As shown in FIG. 2, a filter wafer 100 is provided. The filter wafer 100 comprises a plurality of filter chips 110 to be packaged, each of the filter chips 110 to be packaged being provided with one or more first pads 111. As shown in FIG. 3, solder bumps 120 are disposed on the first pads 111, respectively, and the filter wafer 100 is cut to obtain the plurality of filter chips 110 to be packaged, which are respectively provided with the first pads 111 with the solder bumps 120.

Figure 4:
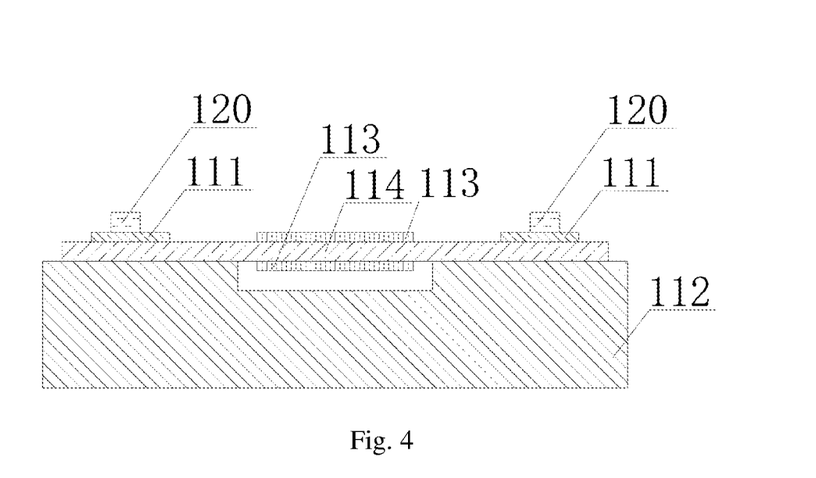
FIG. 4 is a schematic diagram of a filter chip to be packaged according to an embodiment.

As shown in FIG. 4, in some embodiment, the filter chip 110 to be packaged comprises first and second electrode layers 113, a piezoelectric layer 114, a filter chip substrate 112 for supporting the electrode layers 113 and the piezoelectric layer 114, and the plurality of first pads 111 to be connected with a substrate to be packaged. The filter chip substrate 112 is the substrate of the filter chip to be packaged.

In some embodiments, the solder bumps 120 are made of a material adapted for flip-chip bonding, for example, one or more of a solder ball, a copper post, a gold bump and a conductive glue.

Figure 5:
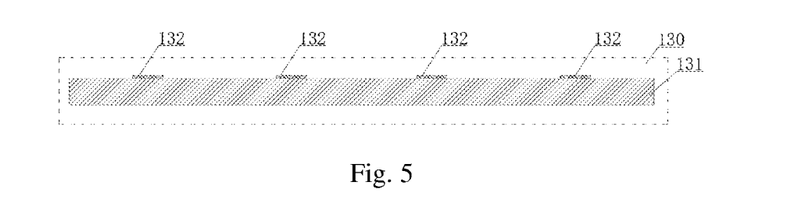
FIG. 5 is a schematic diagram of a substrate to be packaged according to an embodiment.

In some embodiments, as shown in FIG. 5, a substrate to be packaged 130 comprises a substrate base 131 and a plurality of second pads 132.

In some embodiments, both the first pads 111 and the second pads 132 are made of an electrically conductive material such as a metal.

In some embodiments, the flip-chip bonding a plurality of filter chips to be packaged on a substrate to be packaged comprises: flip-chip bonding the filter chips to be packaged on the substrate to be packaged through the first pads 111 and the solder bumps 120.

In some embodiments, the flip-chip bonding method is solder reflow soldering, metal ultrasonic welding, or conductive glue bonding.

Figure 6:
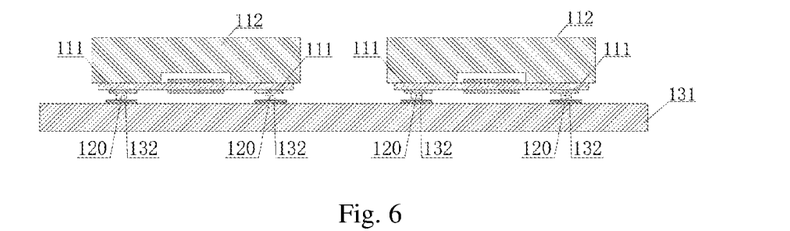
FIG. 6 is a schematic diagram after a filter chip to be packaged is flip-chip bonded to the substrate to be packaged according to an embodiment.

In some embodiments, as shown in FIG. 6, after the filter chips to be packaged are flip-chip bonded on the substrate to be packaged through the first pads 111 and the solder bumps 120, the first pads 111 of the wafer to be packaged are connected with the second pads 132 of the substrate to be packaged through the solder bumps 120, respectively.

Figure 7:
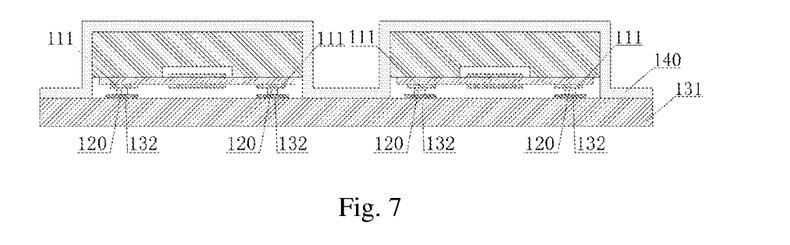
FIG. 7 is a schematic diagram after a first mold material layer is applied on each filter chip to be packaged according to an embodiment.
Figure 8:
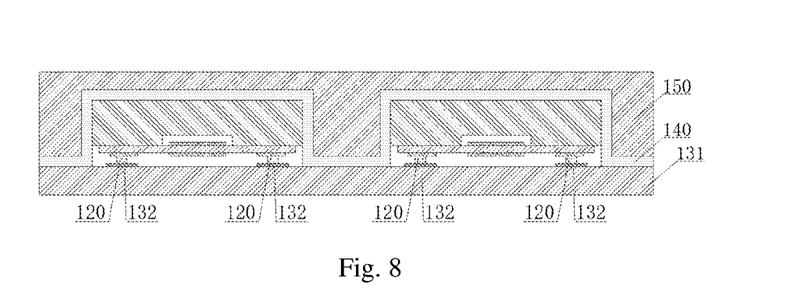
FIG. 8 is a schematic diagram after a second mold material layer is applied on each filter chip to be packaged according to an embodiment.

Referring to FIG. 7 and FIG. 8, in some embodiments, the molding the filter chips to be packaged to form a first mold layer comprises: applying a first mold material layer 140 on the filter chips to be packaged, each filter chip to be packaged, a portion of the first mold material layer applied on the filter chip to be packaged, and the substrate to be packaged together enclosing a cavity (as shown in FIG. 7); and applying a second mold material layer 150 on a side of the first mold material layer 140 away from the filter chip to be packaged (as shown in FIG. 8). The first mold material layer 140 and the second mold material layer 150 form the first mold layer. Each filter chip to be packaged, a portion of the first mold layer corresponding to the filter chip to be packaged, and the substrate to be packaged together enclose a cavity.

As such, the first mold material layer 140 and the second mold material layer 150 may be applied to the surface of the filter chips in a vacuum environment so that the first mold material layer 140 can well encapsulate the filter chips to be packaged along sidewalls of the filter chips to be packaged soldered on the substrate to be packaged. Therefore, each filter chip to be packaged, the first mold material layer corresponding to the filter chip to be packaged, and the substrate to be packaged can form the cavity very well. Meanwhile, the second mold material layer 150 is applied on the side of the first mold material layer 140 away from the filter chips to be packaged to stabilize the piezoelectric and electrode stack film structure suspended on the cavity, so that the piezoelectric and electrode stack film structure may not be easily damaged in a case where the first mold material layer 140 is thinned.

Figure 9:
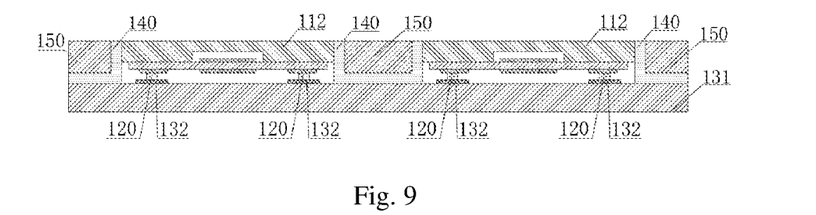
FIG. 9 is a schematic diagram of a second mold structure according to an embodiment.

As shown in FIG. 9, which is a schematic diagram of a second mold structure according to some embodiments, the thinning the first mold structure to obtain a second mold structure comprises: thinning the first mold material layer 140 and the second mold material layer 150 to expose the filter chip substrates 112, all of the filter chip substrates 112 being thinned to a first preset thickness to obtain the second mold structure; a thickness of the second mold structure is smaller than a sum of a thickness of the filter chip to be packaged and a thickness of the substrate to be packaged. That is, the thickness of the second mold structure is smaller than a sum of the thickness of the filter chip to be packaged and the thickness of the substrate to be packaged before thinning.

Figure 10:
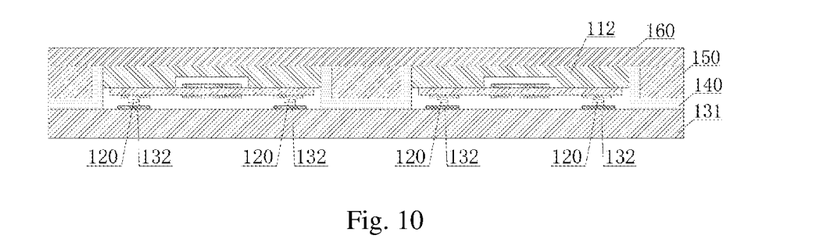
FIG. 10 is a schematic diagram of a second mold structure according to an embodiment.

Referring to FIG. 10, which is a schematic diagram of a second mold structure according to some embodiments, the thinning the first mold structure to obtain a second mold structure comprises: thinning the first mold material layer 140 and the second mold material layer 150 to expose the filter chip substrates 112, and thinning all of the filter chip substrates 112 to a second preset thickness; applying a second mold layer 160 on the exposed filter chip substrates 112 to obtain the second mold structure; a thickness of the second mold structure is smaller than a sum of a thickness of the filter chip to be packaged and a thickness of the substrate to be packaged. That is, the thickness of the second mold structure is smaller than a sum of the thickness of the filter chip to be packaged and the thickness of the substrate to be packaged before thinning.

As such, with the second mold layer 160 being applied on the exposed filter chip substrates 112, the filter chips to be packaged can be protected so that the filter chips to be packaged are not prone to damages.

In some embodiments, the first mold material layer 140 is made of a dry film or a mold thin film.

In some embodiments, the second mold material layer 150 is made of a dry film, a mold thin film or a mold resin material.

In some embodiments, the first mold material layer 140 and the second mold material layer 150 may be made from different materials. As such, the first mold material layer 140 may be referred to as a "first mold layer," the second mold material layer 150 may be referred to as a "second mold layer," and the second mold layer 160 may be referred to as a "third mold layer."

In some embodiments, the first mold material layer 140, the second mold material layer 150, and the second mold layer 160 may be made from different materials.

Figure 11:
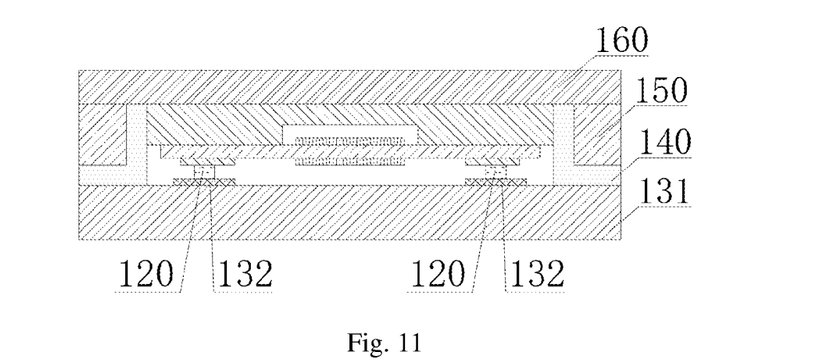
FIG. 11 is a schematic diagram of a particle chip according to an embodiment.

In some embodiments, the second mold structure is cut into a plurality of particle chips, as shown in FIG. 11, which is a schematic diagram of a particle chip.

Figure 12:
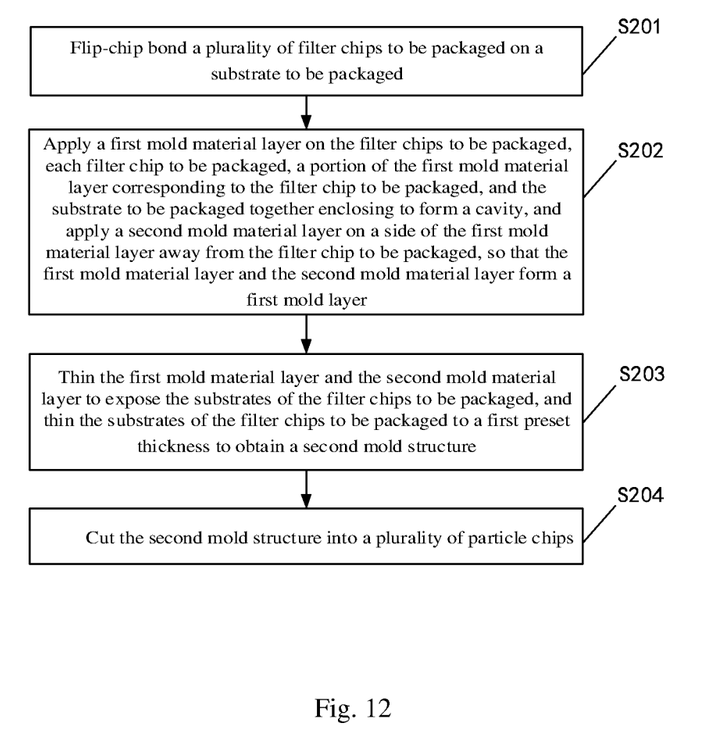
FIG. 12 is a flow chart of a method for packaging chips according to an embodiment.

Referring to FIG. 12, an embodiment of the present disclosure provides a method for packaging chips, comprising:

Step S201: flip-chip bonding a plurality of filter chips to be packaged on a substrate to be packaged;

Step S202: applying a first mold material layer on the filter chips to be packaged, each filter chip to be packaged, a portion of the first mold material layer corresponding to the filter chip, and the substrate to be packaged together enclosing to form a cavity; applying a second mold material layer on a side of the first mold material layer away from the filter chip to be packaged, so that the first mold material layer and the second mold material layer form a first mold layer;

Step S203: thinning the first mold material layer and the second mold material layer to expose the substrates of the filter chips to be packaged, and thinning the substrates of the filter chips to be packaged to a first preset thickness to obtain a second mold structure; a thickness of the second mold structure is smaller than a sum of a thickness of the filter chip to be packaged and a thickness of the substrate to be packaged; and Step S204: cutting the second mold structure into a plurality of particle chips.

By the method for packaging chips according to the present embodiment, the plurality of filter chips to be packaged are flip-chip bonded on the substrate to be packaged; the filter chips to be packaged are molded to form the first mold layer; each filter chip to be packaged, the portion of the first mold layer corresponding to the filter chip to be packaged, and the substrate to be packaged together enclose to form the cavity; the filter chips to be packaged, the first mold layer, and the substrate to be packaged form the first mold structure; the first mold structure is thinned to obtain the second mold structure whose thickness is smaller than a sum of a thickness of the filter chip to be packaged and a thickness of the substrate to be packaged; the second mold structure is cut into a plurality of particle chips. As such, since each filter chip to be packaged, the portion of the first mold layer corresponding to the filter chip to be packaged, and the substrate to be packaged together enclose to form the cavity, it is unnecessary to mold the filter chips to be packaged at the wafer level, that is, it is unnecessary to form a cap wafer. Without the cap wafer being formed, the first mold structure is thinned to form the second mold structure so that the particle chips can be miniaturized.

Figure 13:
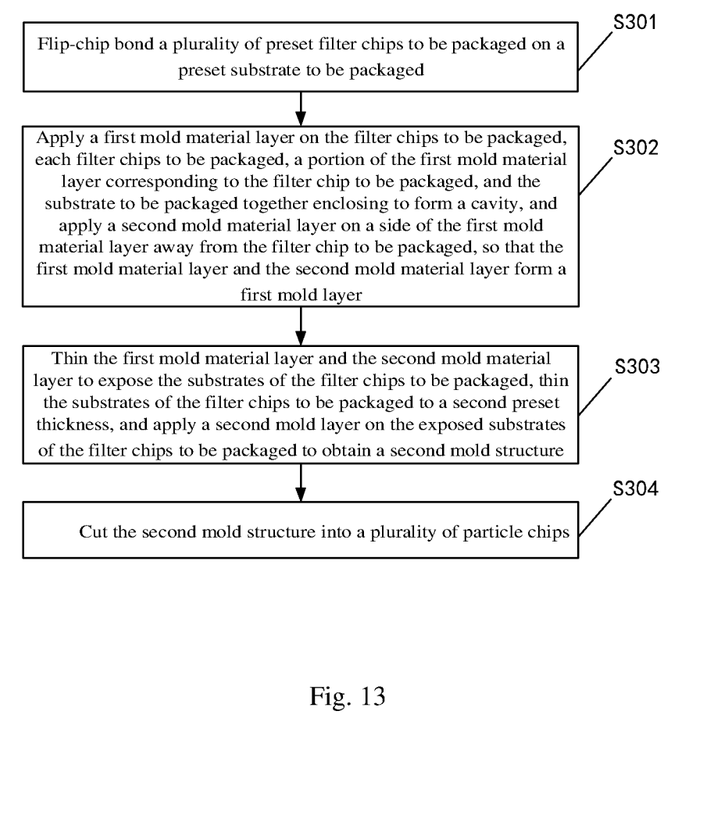
FIG. 13 is a flow chart of a method for packaging chips according to an embodiment.

Referring to FIG. 13, an embodiment of the present disclosure provides a method for packaging chips, comprising:

Step S301: flip-chip bonding a plurality of filter chips to be packaged on a substrate to be packaged;

Step S302: applying a first mold material layer on the filter chips to be packaged, each the filter chip to be packaged, a portion of the first mold material layer corresponding to the filter chip to be packaged, and the substrate to be packaged together enclosing to form a cavity; applying a second mold material layer on a side of the first mold material layer away from the filter chip to be packaged, so that the first mold material layer and the second mold material layer form a first mold layer;

Step S303: thinning the first mold material layer and the second mold material layer to expose the substrates of the filter chips to be packaged, and thinning the substrates of the filter chips to be packaged to a second preset thickness; applying a second mold layer on the exposed substrates of the filter chips to be packaged to obtain a second mold structure; a thickness of the second mold structure is smaller than a sum of a thickness of the filter chip to be packaged and a thickness of the substrate to be packaged; and Step S304: cutting the second mold structure into a plurality of particle chips.

By the method for packaging chips according to the present embodiment, the plurality of filter chips to be packaged are flip-chip bonded on the substrate to be packaged; the filter chips to be packaged are molded to form the first mold layer; each filter chip to be packaged, the portion of the first mold layer corresponding to the filter chip to be packaged, and the substrate to be packaged together enclose to form the cavity; the filter chips to be packaged, the first mold layer, and the substrate to be packaged form the first mold structure; the first mold structure is thinned to obtain a second mold structure whose thickness is smaller than a sum of a thickness of the filter chip to be packaged and a thickness of the substrate to be packaged; the second mold structure is cut into a plurality of particle chips. As such, since each filter chip to be packaged, the portion of the first mold layer corresponding to the filter chip to be packaged, and the substrate to be packaged together enclose to form the cavity, it is unnecessary to mold the filter chips to be packaged at the wafer level, that is, it is unnecessary to form a cap wafer. Without the cap wafer being formed, the first mold structure is thinned to form the second mold structure so that the particle chips can be miniaturized.

An embodiment of the present disclosure provides a particle chip which is manufactured by the methods for packaging chips according to embodiments of the present disclosure.

To manufacture the particle chips according to the present embodiment, the plurality of filter chips to be packaged are flip-chip bonded on the substrate to be packaged; the filter chips to be packaged are molded to form the first mold layer; each filter chip to be packaged, the portion of the first mold layer corresponding to the filter chip to be packaged, and the substrate to be packaged together enclose to form the cavity; the filter chips to be packaged, the first mold layer, and the substrate to be packaged form the first mold structure; the first mold structure is thinned to obtain a second mold structure whose thickness is smaller than a sum of a thickness of the filter chip to be packaged and a thickness of the substrate to be packaged; the second mold structure is cut into a plurality of particle chips. As such, since each filter chip to be packaged, the portion of the first mold layer corresponding to the filter chip to be packaged, and the substrate to be packaged together enclose to form the cavity, it is unnecessary to mold the filter chips to be packaged at the wafer level, that is, it is unnecessary to form a cap wafer. Without the cap wafer being formed, the first mold structure is thinned to form the second mold structure so that the particle chips can be miniaturized.

Referring to FIG. 11, in some embodiments, the substrate to be packaged is used to support the filter chip to be packaged; the filter chip to be packaged is flip-chip bonded on the substrate to be packaged; the first mold layer, the filter chip to be packaged, and the substrate to be packaged enclose to form a cavity. In some embodiments, the first mold layer comprises: the first mold material layer 140 enclosing to form the cavity together with the filter chip to be packaged and the substrate to be packaged; and the second mold material layer 150 disposed on the side of the first mold material layer 140 away from the filter chip to be packaged and the substrate to be packaged. In some embodiments, the second mold layer 160 is disposed on the side of the filter chip to be packaged away from the substrate to be packaged.

The above descriptions illustrate exemplary embodiments of the present disclosure. Unless otherwise explicitly required, the individual components and functions described above are optional, and the order of operations may be changed. Parts and features of some embodiments may be included in or may replace parts and features of other embodiments. Moreover, the terms used in the present application are only used to describe the embodiments and not to limit the claims. In the present disclosure, each embodiment may focus on the differences from other embodiments, and the same or similar portions between all embodiments may be referred to mutually. For the methods, products, etc. disclosed in the embodiments, if they correspond to the method portion disclosed in the embodiments, reference may be made to the descriptions of the method portion for the relevant parts.

What is claimed is:

1. A method for packaging chips, comprising:
flip-chip bonding a plurality of filter chips to be packaged on a substrate to be packaged;
applying a first mold material layer on the plurality of filter chips to be packaged, each filter chip to be packaged, a portion of the first mold material layer corresponding to the filter chip to be packaged, and the substrate to be packaged together enclosing to form a cavity;

applying a second mold material layer on a side of the first mold material layer away from the filter chip to be packaged, the first mold material layer and the second mold material layer forming a first mold layer, and the plurality of filter chips to be packaged, the first mold layer, and the substrate to be packaged forming a first mold structure;

thinning the first mold material layer and the second mold material layer to expose substrates of the plurality of filter chips to be packaged, and thinning the substrates of the plurality of filter chips to be packaged to a preset thickness;

applying a second mold layer on the exposed substrates of the plurality of filter chips to be packaged to obtain a second mold structure, a thickness of the second mold structure being smaller than a sum of a thickness of the plurality of filter chips to be packaged and a thickness of the substrate to be packaged; and cutting the second mold structure into a plurality of particle chips.

2. The method according to claim 1, further comprising obtaining the plurality of filter chips to be packaged, wherein the obtaining comprises:

providing a filter wafer comprising the plurality of filter chips to be packaged, each of the plurality of filter chips to be packaged being provided with one or more first pads;

disposing solder bumps on the one or more first pads, respectively; and cutting the filter wafer to obtain the plurality of filter chips to be packaged, wherein the obtained filter chips to be packaged are provided with the one or more first pads and the respective solder bumps.

3. The method according to claim 2, wherein the flip-chip bonding the plurality of filter chips to be packaged on the substrate to be packaged comprises:

flip-chip bonding the plurality of filter chips to be packaged on the substrate to be packaged through the one or more first pads and the solder bumps.

4. The method according to claim 1, wherein the first mold material layer is made of a dry film or a mold thin film.

5. The method according to claim 1, wherein the second mold material layer is made of a of a dry film, a mold thin film or a mold resin material.

6. The method according to claim 1, wherein the first mold material layer and the second mold material layer are made from different materials.

7. The method according to claim 1, wherein the first mold material layer, the second mold material layer, and the second mold layer are made from different materials.

8. A particle chip, wherein the particle chip is one of the plurality of particle chips manufactured by the method for packing chips according to claim 1, and the particle chip comprises:

the substrate to be packaged for supporting the plurality of filter chips to be packaged;

a filter chip to be packaged, wherein the filter chip to be packaged is one of the plurality of filter chip to be packaged, and the filter chip to be packaged being flip-chip bonded on the substrate to be packaged; and the first mold layer enclosing a cavity together with the filter chip to be packaged and the substrate to be packaged.

9. The particle chip according to claim 8, wherein the first mold layer comprises:

the first mold material layer enclosing the cavity together with the filter chip to be packaged and the substrate to be packaged; and the second mold material layer disposed on a side of the first mold material layer away from the filter chip to be packaged and the substrate to be packaged.

* * * * *